United States Patent [19]

Moon

[11] Patent Number: 4,620,114

[45] Date of Patent: Oct. 28, 1986

[54] SIGNAL STRENGTH DETECTOR

[75] Inventor: Philip A. K. Moon, Wiltshire, England

[73] Assignee: Plessey Overseas Limited, Ilford, England

[21] Appl. No.: 646,113

[22] Filed: Aug. 31, 1984

[30] Foreign Application Priority Data

Sep. 1, 1983 [GB] United Kingdom ................ 8323487

[51] Int. Cl.[4] ...................... H03K 5/24; G01R 19/165
[52] U.S. Cl. .................................... 307/350; 307/358; 307/362; 324/131; 330/2; 455/226
[58] Field of Search .............. 307/350, 355, 362, 358; 330/2, 252, 258; 324/131; 455/226

[56] References Cited

U.S. PATENT DOCUMENTS 4,309,656  1/1982  Okanobu ........................... 307/362
4,513,209  4/1985  Tanabe et al. ..................... 307/355

Primary Examiner—John Zazworsky
Attorney, Agent, or Firm—Fleit, Jacobson, Cohn & Price

[57] ABSTRACT

A signal strength detector comprises first, second and third transistors of the same conductivity type. The emitter electrodes of each transistor are connected together and coupled with one of a pair of dc supply lines. The collector electrodes of the first and second transistors are each coupled with the other of the pair of dc supply lines. The base electrode of the first and second transistors are each coupled via a resistor to the base electrode of the third transistor. The collector electrode of the third transistor is effective to provide a source of output current which is representative of a differential signal level between the base electrodes of the first and second transistors.

16 Claims, 10 Drawing Figures

4,620,114

SIGNAL STRENGTH DETECTOR

FIELD OF THE INVENTION

This invention relates to a signal strength detector and more particularly but not exclusively to a signal strength detector suitable for providing a received signal strength indication (RSSI) for use in radio communications.

There are many applications where it is required to provide some means of determining variation of signal strength either to operate an indicator or to perform a controlling function. One example of the latter use is in cellular radio systems where it is necessary to monitor in a receiver the signal strength received from a plurality of transmissions emanating from different cells so that a decision can be made as to which signal to select for demodulation.

SUMMARY OF THE INVENTION

The present invention seeks to provide a simple RSSI detector and in a particularly advantageous form to provide a detector suitable for use in a cellular radio system.

According to the invention there is provided a signal strength detector comprising: first, second and third transistors of the same conductivity type, each having an emitter electrode, a collector electrode and a base electrode; a pair of dc supply lines, the emitter electrode of each transistor being connected together and coupled with one of the pair of dc supply lines, and the collector electrodes of the first and second transistors each being coupled with the other of the pair of dc supply lines; a first resistor through which the base electrode of the first transistor is coupled to the base electrode of the third transistor; and a second resistor through which the base electrode of the second transistor is coupled to the base electrode of the third transistor, wherein the collector of the third transistor is effective to provide a source of output current which is representative of a differential signal level between the base electrodes of the first and second transistors.

The emitter electrodes of the first, second and third transistors may be coupled with said one of the supply lines via a resistor or alternatively via a constant current source. The constant current source may comprise a fourth transistor of the same conductivity type as the first, second and third transistors and having its collector electrode coupled with their emitter electrodes, its emitter electrode coupled with said one of the supply lines via a resistor and its base electrode coupled with a biasing circuit.

The coupling of the collector electrode of the first or second transistor with said other of the dc supply lines may be via a load across which an output signal is developed. The base electrode of the first transistor may be coupled with a signal input and the base electrode of the second transistor may be decoupled at signal frequencies by means of a capacitor. Such an arrangement is suitable for drive by a single ended input signal coupled to the input. A plurality of such detectors may be connected in a sequence by coupling the collector output signal, developed across the load, to the base electrode of the first transistor of the following detector and the output currents of the third transistor of each detector may be fed to a summing circuit.

In an alternative arrangement the couplings of the collector electrodes of the first and second transistors with said other of the supply lines may be made each via a load such that a differential output signal is developed therebetween. The base electrodes of the first and second transistors may each be coupled to a different input for connection to a differential signal drive. A plurality of such detectors may be connected in sequence by coupling the collector electrodes of the first and second transistors each with a different one of the base electrodes of the first and second transistors of the following detector and the output currents of the third transistor of each detector may be fed to a summing circuit.

In each case the load may be a resistor. The coupling between one detector and the next may be made via an emitter follower circuit.

Alternatively the or each load may comprise an additional transistor of the opposite conductivity type to said first, second and third transistor and which has its emitter electrode coupled with said other of the dc supply lines, its collector electrode coupled with the collector electrode of the first or second transistor and, in each detector but the last, its base electrode biased by coupling with the base electrode of the third transistor of the following stage. The coupling between the collector electrode of the or each additional transistor and the collector electrode of the first or second transistor may be via the collector to emitter path of a further transistor of the same conductivity type as the first, second and third transistors, and the base electrode of the or each further transistor may be coupled with the base electrode(s) of the or each additional transistor. The base electrode(s) of the additional transistor(s) of the last detector may be coupled with the base electrode of the first transistor of the first detector to provide biasing for the detector circuit.

The circuit may be arranged such that the source of output current is substracted from a reference current source to provide a difference current which increases in dependence upon differential signal level between the base electrodes of the first and second transistors of the first detector. The reference current source may be arranged to provide a current value equal to the sum of the currents from all of the detectors in the absence of an input signal, whereby the difference current under such conditions is zero.

BRIEF DESCRIPTION OF THE DRAWINGS

In order that the invention and its various other preferred features may be understood more easily, embodiments thereof will now be described, by way of example only, with reference to the drawings in which.

DETAILED DESCRIPTION OF THE INVENTION

Figure 1:
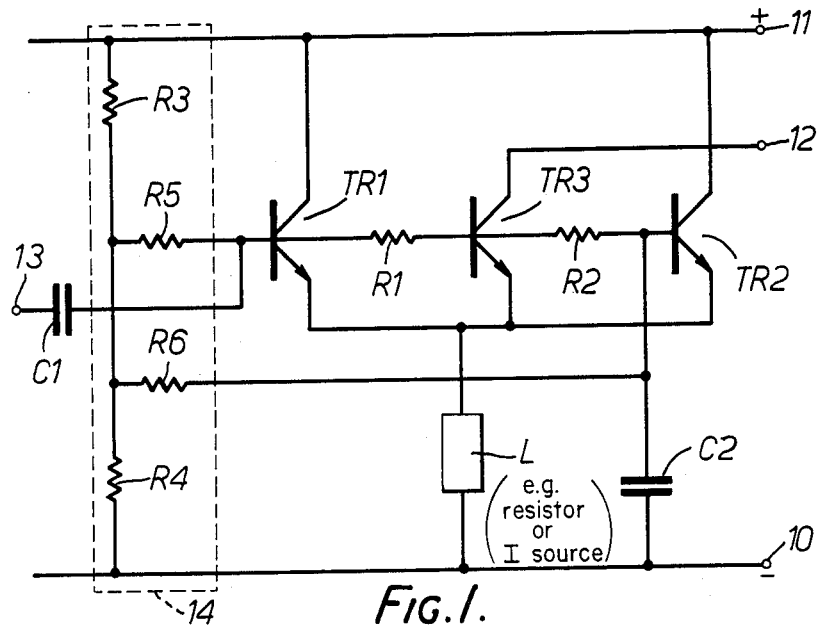
FIG. 1 is a basic circuit schematic of a signal strength detector constructed in accordance with the invention.

Referring now to the drawing of FIG. 1 a basic detector comprises three NPN transistors TR1, TR2 and TR3. The emitter electrodes of the transistors are each coupled together and are coupled to a negative supply line 10 via a load L. The base electrode of transistor TR1 is coupled to the base electrode of transistor TR3 via a resistor R1 and the base electrode of transistor TR2 is coupled to the base electrode of transistor TR3 via a resistor R2.

The collector electrodes of TR1 and TR2 are each coupled to a positive supply line 11. The collector electrode of TR3 is coupled to an output 12 while the base electrode of TR1 is coupled via a capacitor C1 to an input 13. The base electrode of TR2 is coupled to the negative supply line 10 via a capacitor C2. The circuit is biased by any suitable means and for illustrative purposes a bias circuit 14 is shown which comprises a potential divider formed by resistors R3 and R4 connected in series between the supply lines 11 and 10 the junction of which resistors is coupled by individual resistors R5 and R6 to the base electrodes of TR1 and TR2 respectively.

In operation of the basic circuit of FIG. 1 and in the absence of a signal at the input 13, the current passing through the load L is shared by the transistors TR1, TR2 and TR3 and an output current from 12 is representative of zero signal level. When an ac signal is applied to input 13 the current through the transistor TR3 is reduced in proportion to the magnitude of the signal and accordingly the current available from the output terminal 12 is reduced in proportion to signal level. In this way a source of output current is provided which is representative of the signal level on the base of TR1 and accordingly is representative of the differential signal level between the base electrodes of TR1 and TR2.

It will be appreciated that the circuit of FIG. 1 is adapted for operation by a single ended input provided on the input terminal 13 and that the base electrode of TR2 is decoupled at signal frequencies via the capacitor C2 so that the output current is representative of the differential signal measured between the bases of transistors TR1 and TR2. The circuit could be adapted for differential input drive by removing the capacitor C2 and by connecting the base of TR2 to a further input terminal via a capacitor similar to C1 whereupon the circuit would be responsive to a differential input drive provided between the two input terminals.

The load L may be for example a resistor or a constant current source.

Figure 2:
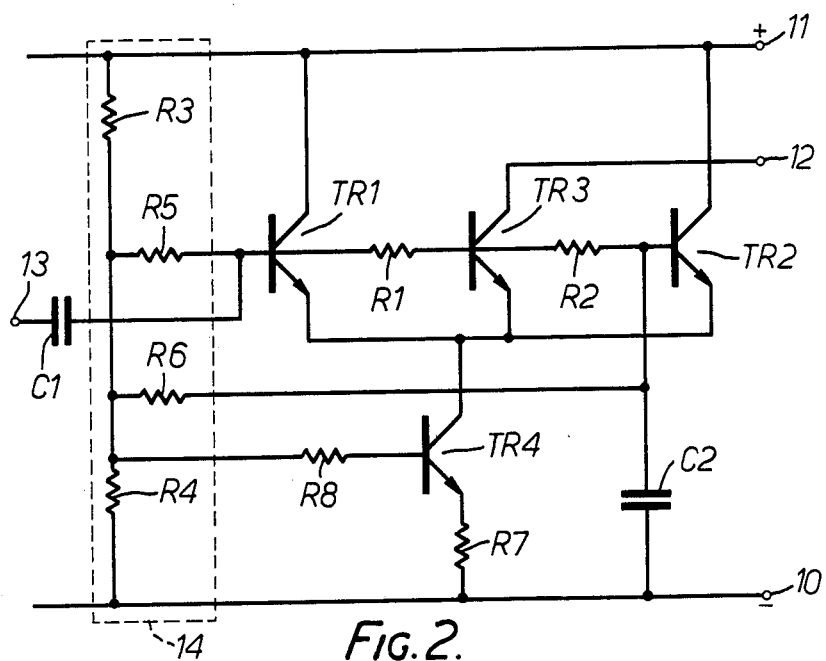
FIG. 2 shows the circuit of FIG. 1 with a constant current source emitter load.

The circuit of FIG. 2 is similar to that of FIG. 1 except that a transistor constant current source is used in the emitter circuit of transistors TR1, TR2 and TR3. An NPN transistor TR4 has its collector electrode coupled to the common emitter connections of transistors TR1, TR2 and TR3, its emitter electrode coupled via a resistor R7 to the negative supply line 10 and its base electrode biased via a resistor R8 from the bias circuit 14. The constant current supplied by the collector of TR4 is shared by the transistors TR1, TR2 and TR3.

The sensitivity and dynamic range of the circuits shown in FIGS. 1 and 2 are somewhat limited and for many applications it is preferred to employ a plurality of such circuits connected in series, each circuit providing an amplified signal level to the following circuit.

Figure 3:
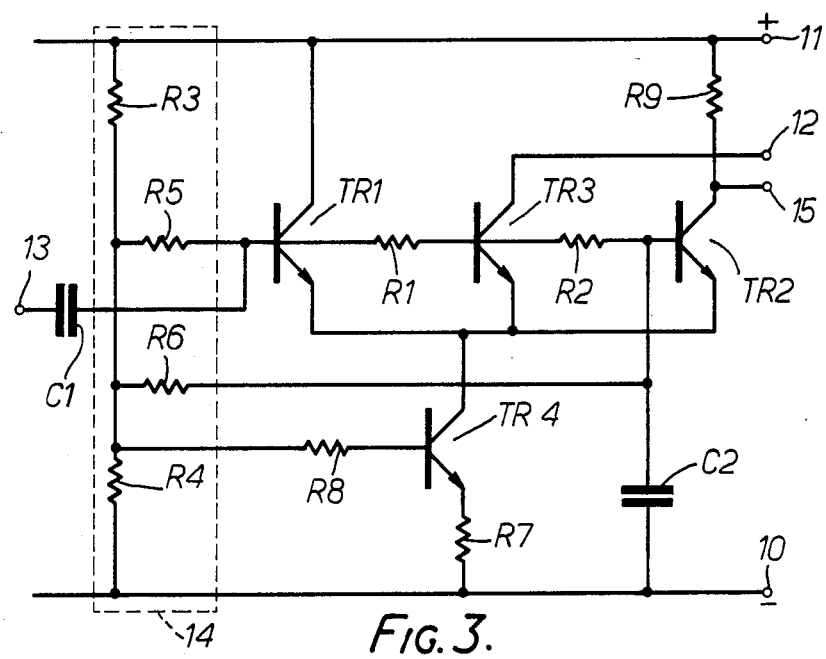
FIG. 3 is a circuit schematic similar to FIG. 2 but adapted to provide an amplified signal suitable for connection to a similar subsequent detector. The output 15 may be coupled with the following detector via a buffer stage e.g. an emitter follower to avoid loading of the amplifier by the subsequent detector.

One way of providing an amplified signal is shown in FIG. 3. Here, a load in the form of a resistor R9 is provided in the collector circuit of the transistor TR2 between collector and positive supply line 11. An amplified signal voltage is developed across the resistor R9 and appears at an output 15 for connection to the input 13 of a similar detector. A series of such detectors may be connected together to form a signal strength detector circuit and the outputs 12 in each case are summed to provide a current representative of the signal level. It will be appreciated that as the input level to the first detector is increased it will reach a point where the last detector in the series arrangement limits and as it is increased still further detectors are progressively limited but the summed currents remains representative of the input signal level until all stages are limited. It will be appreciated that the collector circuit of transistor TR1 may also be provided with a resistor similar to R9 thereby permitting differential drive to a following circuit by connection of the collector of TR1 to the base of TR2 of the subsequent stage via a capacitor.

A particularly advantageous refinement of the invention is the replacement of resistor R9 by an active transistor load. Such an arrangement is shown in FIG. 4.

Figure 4:
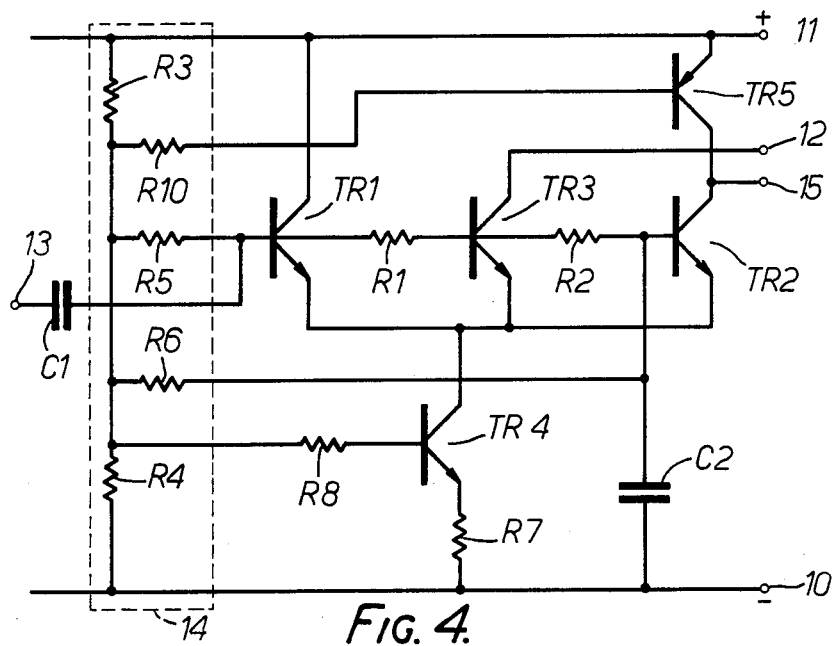
FIG. 4 is a circuit schematic similar to FIG. 3 but employing an active load.

In FIG. 4 the resistor R9 is dispensed with and in its place there is provided a PNP transistor TR5 having its collector electrode coupled to the collector electrode of TR2 and its emitter electrode coupled to the positive supply line 11. The base electrode of TR5 is biased from the bias circuit via a resistor R10. When a plurality of detectors such as illustrated in FIG. 4 are cascaded by connection of the output 15 to the input 13 of a following detector, the resistors R1 and R2 are reflected as the load for the previous stage. This has the advantage of eliminating load resistors and avoiding buffer stages between detectors, e.g. emitter followers. Again, a transistor similar to TR5 may be incorporated in the collector circuit of TR1 to provide an additional output and differential drive for the subsequent detector.

In some circumstances it may be advantageous for gain considerations to include in the collector circuit of TR1 and TR2 additional cascode transistors. Such inclusion can be made in any one of the circuits of FIGS. 1 to 4 and for illustrative purposes this is shown in FIG. 5 as a modified version of FIG. 3 but adapted to provide differential drive to a following detector.

Figure 5:
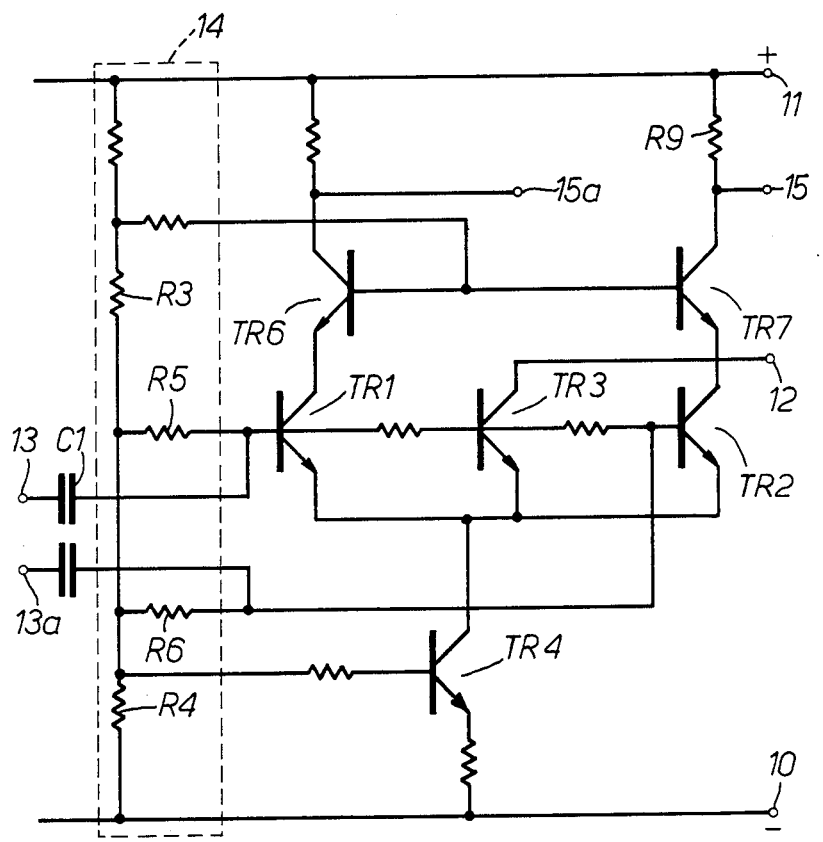
FIG. 5 is a circuit schematic based on FIG. 3 but including cascode transistors and providing differential outputs.

The drawing of FIG. 5 shows additional NPN cascode transistors TR6 and TR7 connected in the collector circuits of transistors TR1 and TR2 respectively. The collector of TR2 is connected to the emitter of TR7 the collector of which is connected via resistor R9 to the positive voltage supply line 11. The transistor TR6 is similarly connected in the collector of TR1. The base electrodes of TR6 and TR7 are coupled together and biased from the bias circuit 14 via a resistor. The cascode transistors operate in a known manner to provide increased stage gain.

Figure 6:
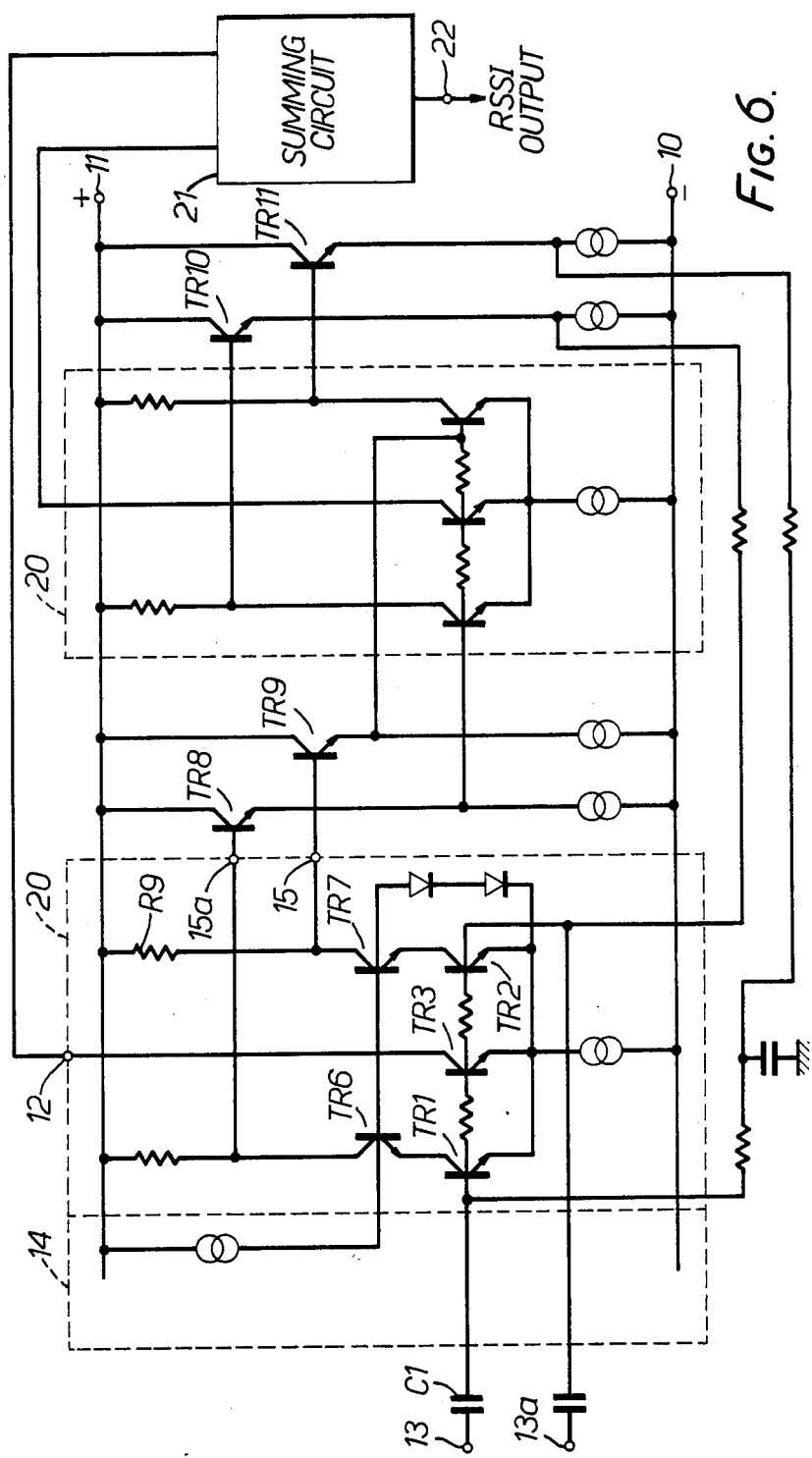
FIG. 6 is a signal strength detector circuit constructed in accordance with the invention and based on the detector of FIG. 5.

A plurality of detector circuits as described in FIGS. 3 to 5 may be employed in succession to provide a multi stage detector circuit. Examples of such circuits are shown in FIGS. 6 to 10. Referring now to FIG. 6, a circuit based on the detector of FIG. 5 is shown, but with differential drive between one detector and the next, the coupling there between being effected by way of emitter follower transistors TR8 and TR9. In the illustrated embodiment only two detectors are shown connected in series but it will be understood that more than two detectors can be interconnected in succession in a similar way. The outputs from transistors TR3 in each of the detectors are taken to the input of a summing circuit 21 that provides an RSSI output on terminal 22. The two detector stages are indicated at 20. A dc feed back path is provided between the first and the last stages by providing emitter follower transistors TR10 and TR11 which are connected to the collectors of transistors TR1 and TR2 respectively of the last detector stage and have their emitters coupled via resistive networks to the base electrodes of TR2 and TR1 respectively of the first detector stage.

Figure 7:
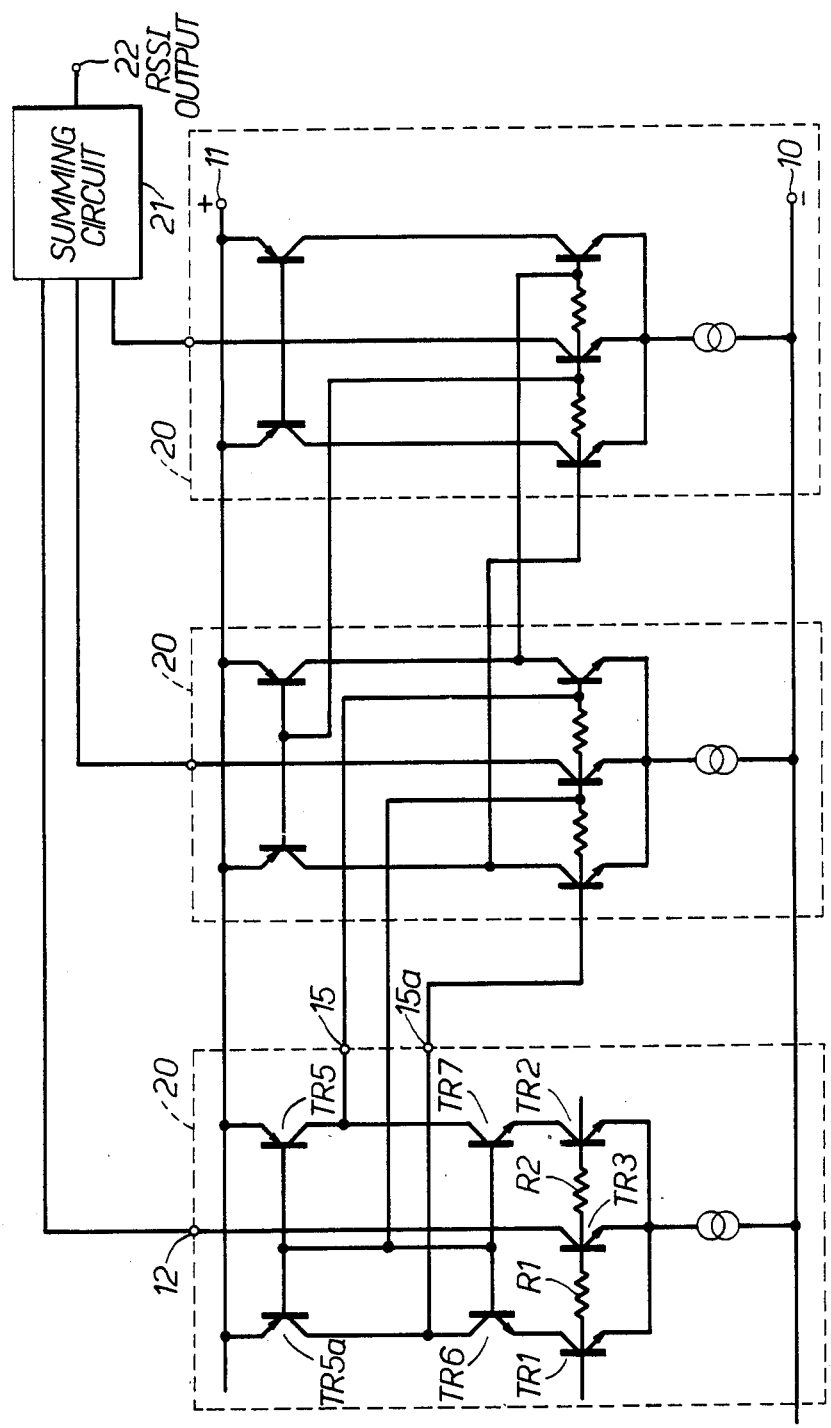
FIG. 7 is a signal strength detector circuit constructed in accordance with the invention employing three detectors based on the detector of FIG. 5 but employing the active load arrangement of FIG. 4.

The drawing of FIG. 7 shows a signal strength detector which employs three detectors based on the circuit of FIG. 5 but also including the active load arrangement of FIG. 4. The biasing arrangement is not shown in detail but may be arranged similarly to that of FIG. 6. However, the circuit of FIG. 7 employs a particularly advantageous form of biasing for the active load transistors and the cascode transistors. This can be seen in that the base electrodes of the active load transistors TR5,TR5A and the base electrodes of the cascode transistors TR6 and TR7 are all connected together and are coupled with the base electrode of TR3 of the following stage.

Although the circuit of FIG. 7 is arranged to provide differential drive from one stage to the next it can be converted easily to single drive by connecting the base and collector of TR5A which then operates as a diode.

In integrated circuit processing designed for producing high gain NPN transistors it is often difficult to provide high gain from PNP transistors. Accordingly in the arrangement of FIG. 7 the base current drawn by transistors TR5 and TR5A can sometimes be sufficient to upset the balance of the biasing arrangement for transistors TR1,TR2 and TR3 of the following detector. This problem is obviated by the modification shown in FIG. 8 where an additional PNP transistor is provided in the bias line between the base electrodes TR5,TR5A and the base electrode of TR3 of the following stage. The base electrode of TR3 of the following stage is connected to the base electrode of TR12 the emitter of which is connected to the base electrodes of TR5 and TR5A. The collector electrode of TR12 is connected to the negative potential line 10.

Figure 8:
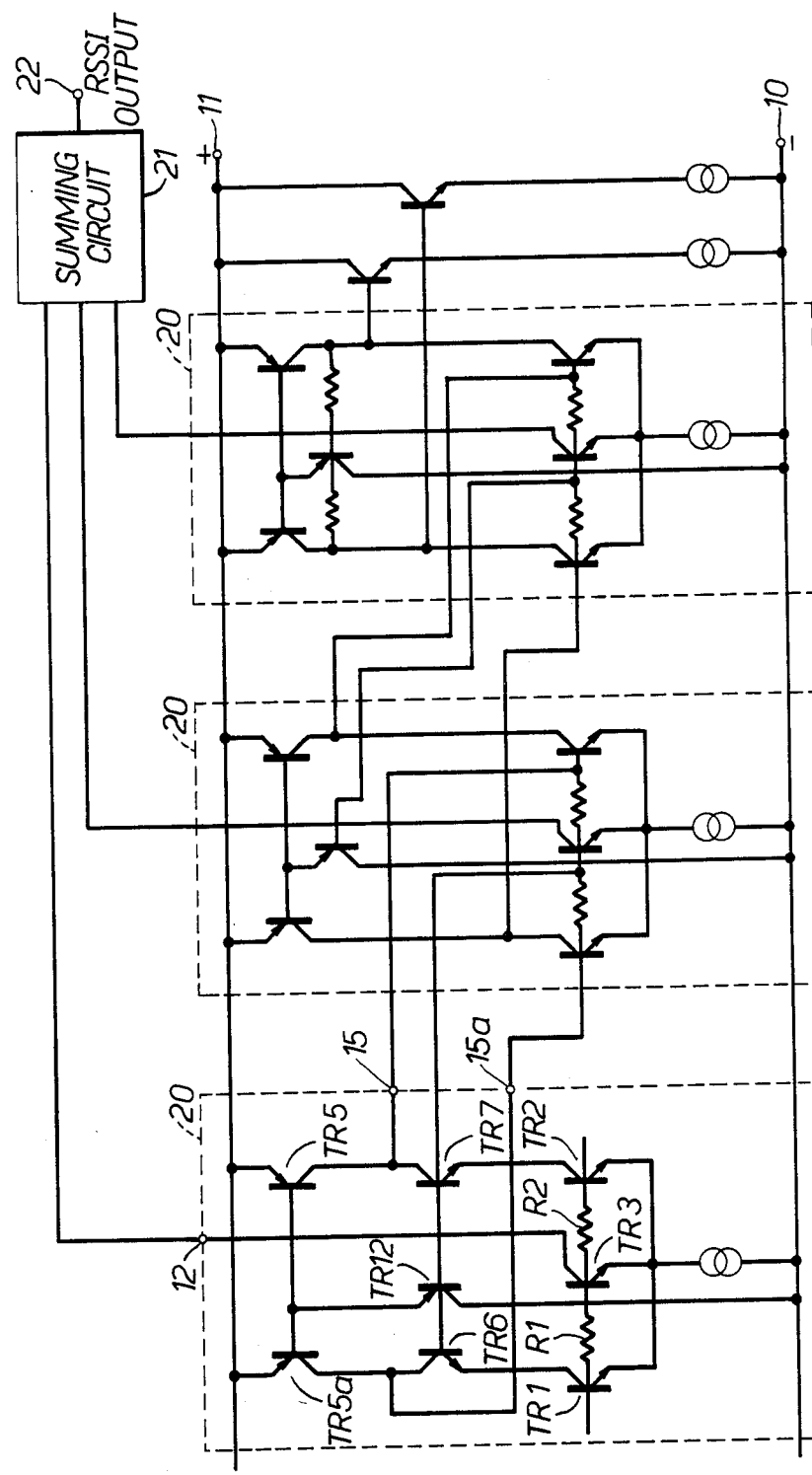
FIG. 8 is a circuit similar to FIG. 7 but including a buffer transistor in the bias circuit prior to the active load transistors.
Figure 9:
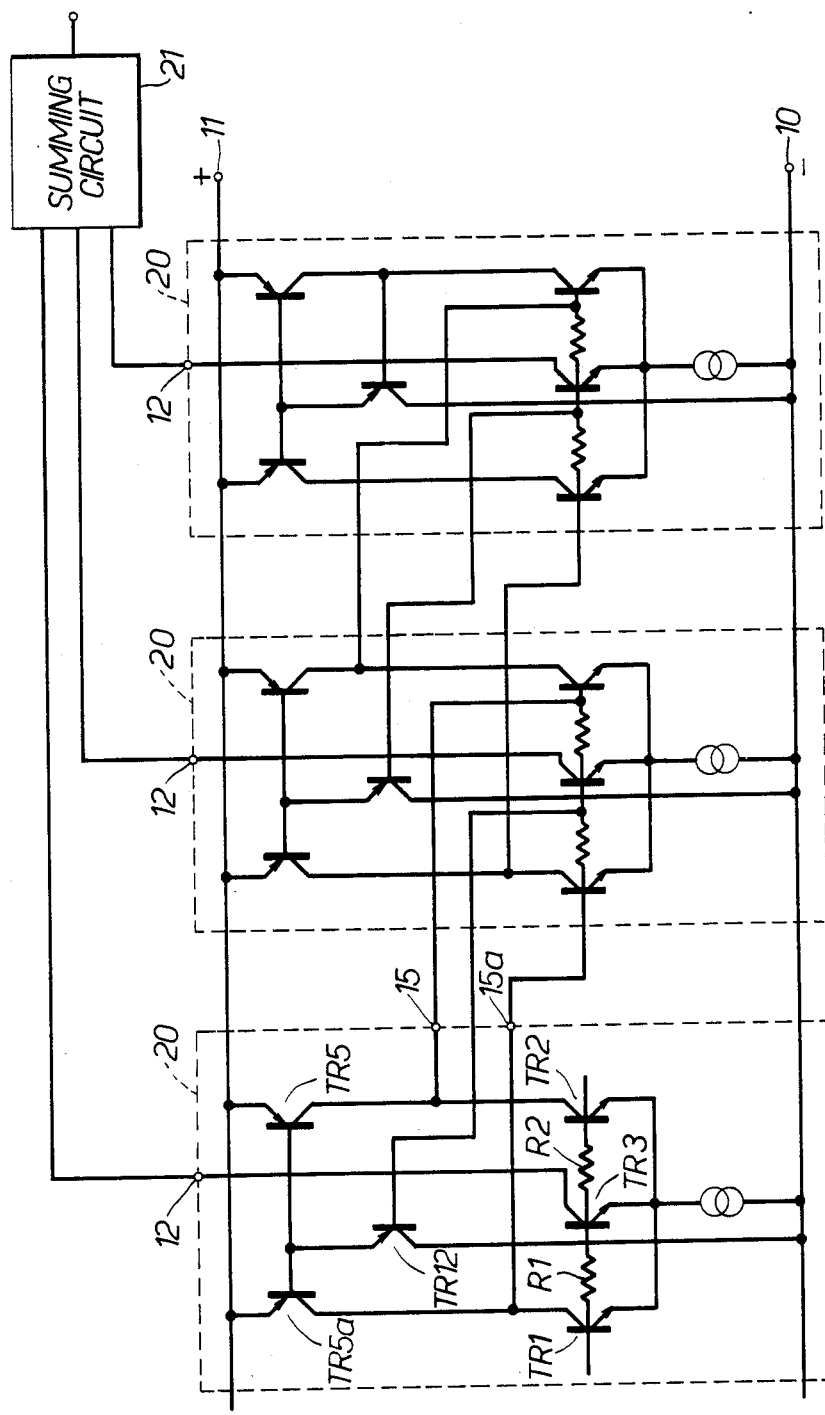
FIG. 9 is a circuit similar to FIG. 8 in which no cascode transistors are employed, and, FIG. 10 is a particularly advantageous implementation of the invention as an IF amplifier for a cellular radio system and provides an RSSI output.

The drawing of FIG. 9 shows a modified version of the drawing of FIG. 8 and in this case the cascode transistors TR6 and TR7 are omitted but biasing for the transistors TR5 and TR5A is still maintained via a buffer transistor TR12.

Figure 10:
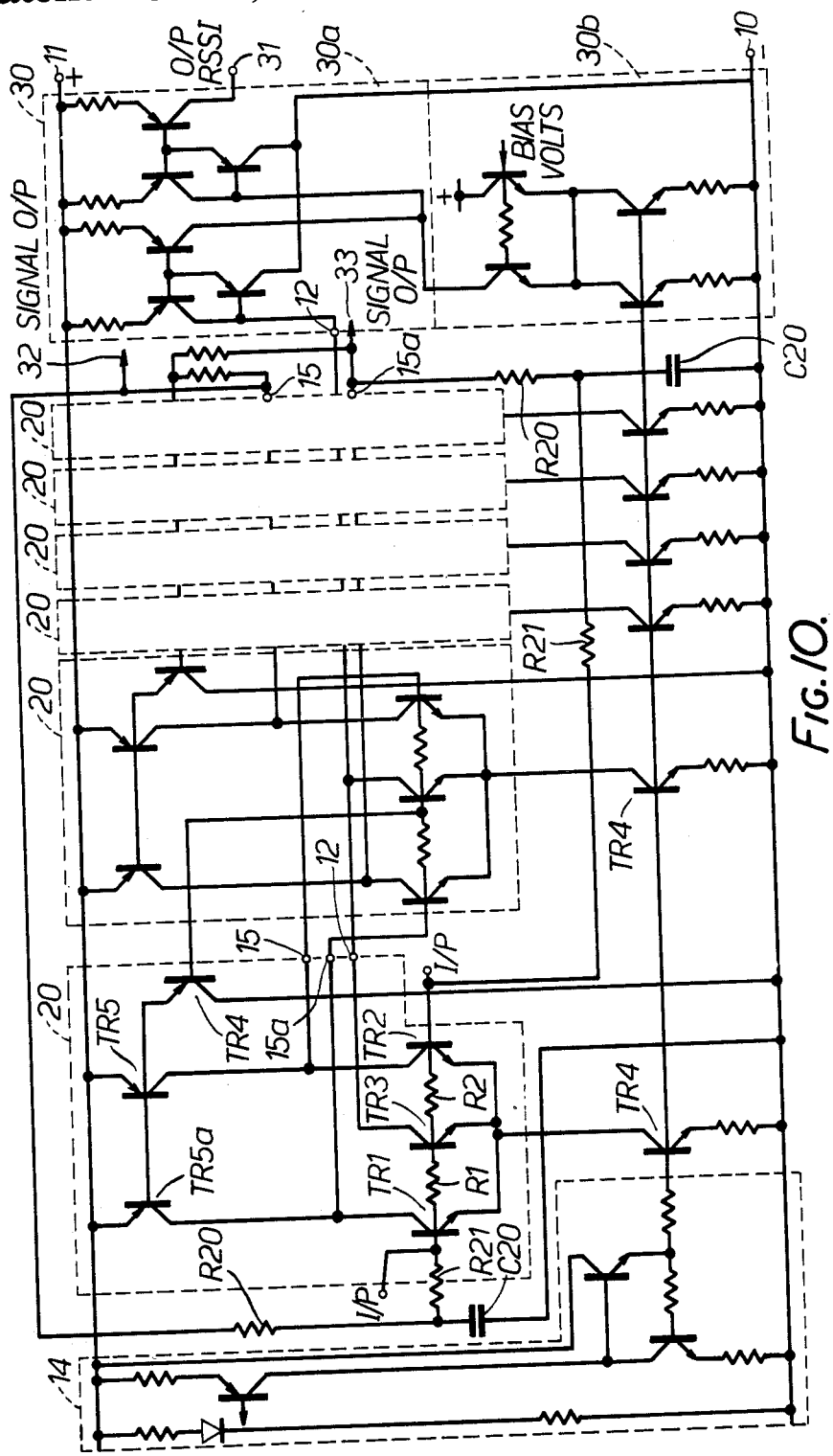

A particularly advantageous implementation of the principles previously described is shown in FIG. 10 which shows an IF amplifier for a cellular radio system. The system comprises six identical detector stages 20 similar to those illustrated in FIG. 9. The stages are connected one after another and in this case self-biasing is provided by linking the outputs 15 and 15A from the two loads of the last stage back to the bases of transistors TR1 and TR2 of the first stage in each case via a pair of series resistors R20 and R21, the junction of the two resistors being decoupled at signal frequencies by a capacitor C20. The constant current source for each stage formed by a transistor TR4 is biased at a common voltage from the bias circuit 14 so that each stage operates with the same current capability. The output current from the collector of each transistor TR3 provided at the output 12 from each detector is connected to a common line which is fed as an input signal to a current mirror circuit 30. It will be appreciated that each detector circuit 20 provides an output current which is representative of its own input signal and that this current reduces as a function of increasing signal level. Furthermore as the signal level is amplified from stage to stage the first stage will produce a relatively high output current while the later stages will produce relatively low output currents. The aggregate output current which is provided as a signal input to the current mirror circuit 30 is therefore a value which again reduces with increasing signal level. In the normal circumstances it is preferable to have a current which is positively related to increasing signal level and the mirror circuit 30 is arranged to provide an output RSSI current on the output 31 which does in fact increase as a function of increasing signal level at the inputs to the first stage. The current mirror circuit is a simple circuit in which the lower portion 30b provides a constant current of a value that is equal and opposite to the current provided at the input to the mirror circuit from the detectors in the absence of an input signal to the first detector stage. The current source portion 30b is biased from the same point in the bias circuit 14 as the detector stages so that any current variation due to temperature changes is identical with the current variation provided by the current sources TR4 for each of the detectors and accordingly any current changes due to temperature are the same in the detectors as in the circuit portion 30B so that variations are cancelled in the current mirror 30. The current mirror effectively subtracts the aggregate output currents of the six detectors from a fixed current to provide the RSSI output current.

The IF amplifier of FIG. 10 provides a differential output signal between the outputs 32 and 33 but it will be appreciated that the circuit can be modified in accordance with the previously described principles to provide a single ended output and to provide single ended drive between stages. The circuit of FIG. 10 can employ detectors modified in compliance with any one of the detectors described in FIGS. 3 to 5.

The circuits described are particularly suitable for fabrication in integrated circuit form. Some possible applications for the invention are in cellular radio, cordless telephones, low power radio receivers.

I claim:

1. A signal strength detector, comprising: first, second and third transistors of the same conductivity type, each having an emitter electrode, a collector electrode and a base electrode; a pair of dc supply lines, the emitter electrode of each transistor being connected together and coupled to one of the pair of dc supply lines via a constant current source, and the collector electrodes of the first and second transistors each being coupled with the other of the pair of dc supply lines; a first resistor through which the base electrode of the first transistor is coupled to the base electrode of the third transistor; and a second resistor through which the base electrode of the second transistor is coupled to the base electrode of the third transistor, wherein the collector electrode of the third transistor is effective to provide a source of output current which is representative of a differential signal level between the base electrodes of the first and second transistors.

2. A detector as claimed in claim 1, wherein the emitter electrodes of the first, second and third transistors are coupled with said one of the supply lines via a resistor effective as said constant current source.

3. A detector as claimed in claim 1, wherein the constant current source comprises a fourth transistor of the same conductivity type as the first, second and third transistors and having its collector electrode coupled with their emitter electrodes, its emitter electrode coupled with said one of the supply lines via a resistor and its base electrode coupled with a biasing circuit.

4. A detector as claimed in claim 1, wherein the coupling of the collector electrode of one of the first or second transistors with said other of the dc supply lines is via a load across which an output signal is developed.

5. A detector as claimed in claim 4, wherein the base electrode of the first transistor is coupled with a signal input and the base electrode of the second transistor is decoupled at signal frequencies by means of a capacitor.

6. A signal strength detector circuit, comprising a plurality of detectors as claimed in claim 5 connected in sequence by coupling the collector output signal, developed across the load, to the base electrode of the first transistor of the following detector and in which the output currents of the third transistor of each detector are fed to a summing circuit.

7. A detector as claimed in claim 4, wherein the couplings of the collector electrode of both of the first and second transistors with said other of the supply lines are each made via a load such that a differential output signal is developed therebetween.

8. A detector as claimed in claim 7, wherein the base electrodes of the first and second transistors are each coupled to a different input for connection to a differential signal drive.

9. A signal strength detector circuit, comprising a plurality of detectors as claimed in claim 8 connected in sequence by coupling the collector electrodes of the first and second transistors each with a different one of the base electrodes of the first and second transistors of the following detector and in which the output currents of the third transistor of each detector are fed to a summing circuit.

10. A signal strength detector circuit as claimed in claim 9, wherein coupling between one detector and the next is made via an emitter follower circuit.

11. A signal strength detector circuit as claimed in claim 6, wherein the load comprises an additional transistor of the opposite conductivity type to said first, second and third transistor and which has its emitter electrode coupled with said other of the dc supply lines, its collector electrode coupled with the collector electrode of the first or second transistor and, in each detector but the last, its base electrode biased by coupling with the base electrode of the third transistor of the following stage.

12. A signal strength detector circuit as claimed in claim 11, wherein the coupling between the collector electrode of the additional transistor and the collector electrode of the first or second transistor is via the collector to emitter path of a further transistor of the same conductivity type as the first, second and third transistors, and the base electrode of the or each futher transistor is coupled with the base electrode of the additional transistor.

13. A signal strength detector circuit as claimed in claim 11 wherein the coupling between the base electrode of the third transistor of the following stage with the base electrode of the or each additional transistor is via an emitter follower.

14. A signal strength detector circuit as claimed in claim 11, wherein the base electrode of the additional transistor of the last detector is coupled with the base electrode of the first transistor of the first detector to provide biasing for the detector circuit.

15. A signal strength detector circuit as claimed in claim 6 wherein the summed output currents is substracted from a reference current source to provide a difference current which increases in dependence upon differential signal level between the base electrodes of the first and second transistors of the first detector.

16. A signal strength detector circuit as claimed in claim 15, wherein the reference current source is arranged to provide a current value equal to the sum of the currents from all of the detectors in the absence of an input signal, whereby the difference current under such conditions is zero.

* * * * *